United States Patent
Lin et al.

(10) Patent No.: US 6,757,031 B2
(45) Date of Patent: Jun. 29, 2004

(54) METAL CONTACT STRUCTURE AND METHOD FOR THIN FILM TRANSISTOR ARRAY IN LIQUID CRYSTAL DISPLAY

(75) Inventors: Wen-Jian Lin, Hsinchu (TW); Wei-Chou Lan, Tai-Chung (TW)

(73) Assignee: Prime View International Co., Ltd., Hsinchu (TW)

( * ) Notice: Subject to any disclaimer, the term of this patent is extended or adjusted under 35 U.S.C. 154(b) by 672 days.

(21) Appl. No.: 09/780,774

(22) Filed: Feb. 9, 2001

(65) Prior Publication Data

US 2002/0109796 A1 Aug. 15, 2002

(51) Int. Cl.[7] .................... G02F 1/1343; G02F 1/136
(52) U.S. Cl. ......................... 349/43; 349/39; 349/148
(58) Field of Search ........................... 349/43, 39, 148

(56) References Cited

U.S. PATENT DOCUMENTS 5,825,449 A * 10/1998 Shin ........................... 349/148
6,407,780 B1 * 6/2002 Sung ........................... 349/43
6,411,346 B1 * 6/2002 Numano et al. ............... 349/39

* cited by examiner

*Primary Examiner*—Julie Ngo
(74) *Attorney, Agent, or Firm*—Thomas, Kayden, Horstemeyer & Risley

(57) ABSTRACT

Disclosed is a metal contact structure and method for a thin film transistor array in liquid crystal display in order to prevent source/drain electrode metal layer from plasma damage and oxide insulator formation thereon during contact hole process, such that low contact resistance is obtained between the source/drain electrode metal layer and top-ITO conductive layer, wherein a thin film transistor structure is formed on a substrate and a metal oxide conductive film is covered on the source/drain electrode metal layer of the thin film transistor structure before an insulative passivation layer is deposited over the thin film transistor structure. During the passivation layer is etched to form contact hole for the source/drain electrode metal layer to contact with the top-ITO conductive layer thereafter formed, the metal oxide conductive film prevents the underlying source/drain electrode metal layer from plasma damage and oxide insulator formation thereon, thereby obtaining good contact between the source/drain electrode metal layer and the top-ITO conductive layer.

6 Claims, 5 Drawing Sheets

METAL CONTACT STRUCTURE AND METHOD FOR THIN FILM TRANSISTOR ARRAY IN LIQUID CRYSTAL DISPLAY

FIELD OF THE INVENTION

The present invention relates generally to a thin film transistor liquid crystal display (TFT-LCD) and method of forming the same, and more particularly, to a metal contact structure and method for thin film transistor array in liquid crystal display in order to prevent source/drain electrode metal layer from plasma damage and oxide insulator formation thereon during contact hole etching process, such that low contact resistance is obtained between the source/drain electrode metal layer and top ITO conductive layer.

BACKGROUND OF THE INVENTION

An active matrix LCD device is typically composed of a matrix of liquid crystal pixels with a thin film transistor array that serves as the switching element of the pixels to effect optical characteristics of the pixel liquid crystal for image display by the control of the thin film transistor. The applications for LCD are very appreciated due to their thin in volume and low power consumption. However, local defects in the thin film transistor array for large-scale sized LCD devices could easily result in a reduced yield due to the large-scale area. The manufacture of the thin film transistor array therefore has high impact on the yield of the LCD devices.

On the other hand, the prior art replaces conventional processes with the one that uses one less mask to increase throughput for the TFT-LCD manufacture. In addition, an ITO ($In_2SnO_5$) conductive layer is often employed to cover on top surface of the whole thin film transistor structure to electrically connect the pixel electrode with the source/drain electrode thereof, in order to decrease the manufacturing steps for thin film transistor array, reduce the possibility of short circuit between elements, and increase the open ratio of the display device. In a five-mask process prior art for the thin film transistor array, the etching depths of the first and second metal layers in the contact hole etching process are different, the second metal layer will thus suffer from serious plasma damage by the contact hole etching process. Moreover, an oxide insulator layer could be formed on the second metal layer during the contact hole etching process, resulting in a further degradation of contact resistivity.

A structure of the conventional 5-mask thin film transistor is shown in FIG. 1 for illustration, whose manufacturing process comprises forming a gate electrode 11 on a transparent substrate 10 and then depositing a gate insulator layer 12 that is further deposited with an intrinsic semiconductor layers 13 and a doped semiconductor layer 14 thereon. A source/drain electrode metal layer 15 is deposited, patterned, and etched after the semiconductor layers 13 and 14 are patterned and etched. Then, the doped semiconductor layer 14 is etched, and an insulative passivation layer 16 is deposited over the structure. Contact holes 18 and 19 are formed in the passivation layer 16 by etching process. An ITO conductive layer is finally deposited, patterned, and etched.

The etching depths of the top and bottom metal layers 15 and 11 during the contact hole etching process are different, as shown in the figure, the formation of the contact hole 18 needs to etch through the passivation layer 16 and insulator layer 12, while only the passivation layer 16 is etched for the contact hole 19. When the contact hole 18 is satisfied, the top metal layer 15 suffers from plasma damage, thereby increasing the contact resistivity between the metal layer 15 and the top ITO layer 17 in the contact hole 19. Moreover, over-etching is often employed in the prior art to obtain a sufficient etching depth of the contact hole 18, so that the metal layer 15 is more seriously damaged. Further, an oxide insulator layer could be formed on top surface of the metal layer 15 in the contact hole 19 during the plasma etching of the contact hole 19, which will increase the contact resistivity between the metal layer 15 and the top ITO conductive layer 17 due to the insertion of the residue oxide insulator layer into the contact structure.

To resolve such problems, there have been disclosed several methods, such as chemical wet etching process, instead of plasma dry etching process, is employed to form the contact holes. However, the controllability of wet etching is worse than that of dry etching, and the contact hole formed by wet etching is larger than that by dry etching. Another prior art comprises an additional physical dry processing or chemical wet processing to remove the plasma-damaged layer and oxide insulator layer on the top surface of the second metal electrode, while such process will bring in more systematic complexity and another damages to the device.

Pan et al. improved the method of forming TFT-LCD with multi-layer metal electrode in Taiwan Pat. Application No. 88107676, which increases the etching selectivity of the insulative passivation layer to the contact layer of the multi-layer metal, in order to depress the etching damage to the multi-layer metal in the formation of the contact holes. However, Pan et al. did not know the damage to the source/drain electrode metal due to the different etching depths of the different metal layers in this prior art. Pan et al. also did not disclose the recipe for the high etching selectivity process, which seems to be a chemical wet etching. In addition, the oxide insulator layer formed during the etching process to form the contact holes has never been mentioned in this prior art.

In Japan Pat. Publication No. 11-283934, Kazunori et al. provided a method comprising surface treatment to the exposed contact region of the electrode metal layer after etching the contact holes, in order to remove the residue material comprising oxygen or carbon formed on the contact surface, thereby decreasing the contact resistivity. Similarly, Kazunori et al. did not know the damage to the source/drain electrode metal due to the different etching depths of the different metal layers, thus they cannot prevent the electrode metal layer from plasma damage during the contact hole etching process, except for removing the insulator layer formed on the electrode metal.

These prior arts can not simultaneously resolve the problems of plasma damage to the source/drain electrode metal due to the different etching depths of the different contact holes and the oxide insulator formation during the contact hole process. Therefore, it is desired a metal contact structure and method for thin film transistor array in liquid crystal display in order to prevent the source/drain electrode metal layer from plasma damage and oxide insulator formation thereon during the contact hole etching process, such that low contact resistance is obtained between the source/drain electrode metal layer and top ITO conductive layer.

SUMMARY OF THE INVENTION

An object of the present invention is to disclose a metal contact structure and method for thin film transistor array in liquid crystal display, by which the source/drain electrode metal layer thereof is prevented from plasma damage and oxide insulator formation thereon during the contact hole etching process, such that low contact resistance is obtained between the source/drain electrode metal layer and top ITO conductive layer.

According to the present invention, a thin film transistor comprises a gate electrode formed on a transparent substrate with a gate insulator layer covered on the gate electrode and an intrinsic semiconductor layer and a doped semiconductor layer formed on the gate insulator layer, and a source/drain electrode metal layer formed on the doped semiconductor layer with a metal oxide conductive film covered thereon. An insulative passivation layer covers on the transistor structure with a contact hole formed thereof through the passivation layer to reach the metal oxide conductive film, and a transparent top ITO conductive layer is formed on the passivation layer and electrically connects with the metal oxide conductive film in the contact hole.

For forming the thin film transistor, a gate electrode is formed on a substrate, a gate insulator layer is deposited to cover on the gate electrode, an intrinsic semiconductor layer and a doped semiconductor layer are deposited on the gate insulator layer, patterned and etched, a source/drain electrode metal layer is deposited. A metal oxide conductive film is then deposited on the source/drain electrode metal layer, which will protect the source/drain electrode metal layer from plasma damage and oxide insulator layer formation thereon during the contact hole etching process thereafter. The metal oxide conductive film and source/drain electrode metal layer are patterned and etched after the metal oxide conductive film is deposited, the doped semiconductor layer is subsequently etched, and an insulative passivation layer is deposited and etched to form a contact hole. An ITO conductive layer is deposited and filled in the contact hole to electrically connect with the metal oxide conductive film, and then patterned and etched.

In the method of the present invention, the plasma dry etching with the passivation layer to form the contact hole has excellent process controllability, and the contact hole thus formed has small aperture, while the metal oxide conductive film protects the source/drain electrode metal layer from plasma damage and oxide insulator layer formation thereon during the contact hole etching process, so that the source/drain electrode metal layer needs no surface treatment by chemical wet etching process after the contact hole is formed in order to obtain a good contact resistivity in subsequent process.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIG. 3 provides one embodiment method to form the structure shown in FIG. 2, wherein

DETAILED DESCRIPTION OF THE INVENTION

Figure 1:
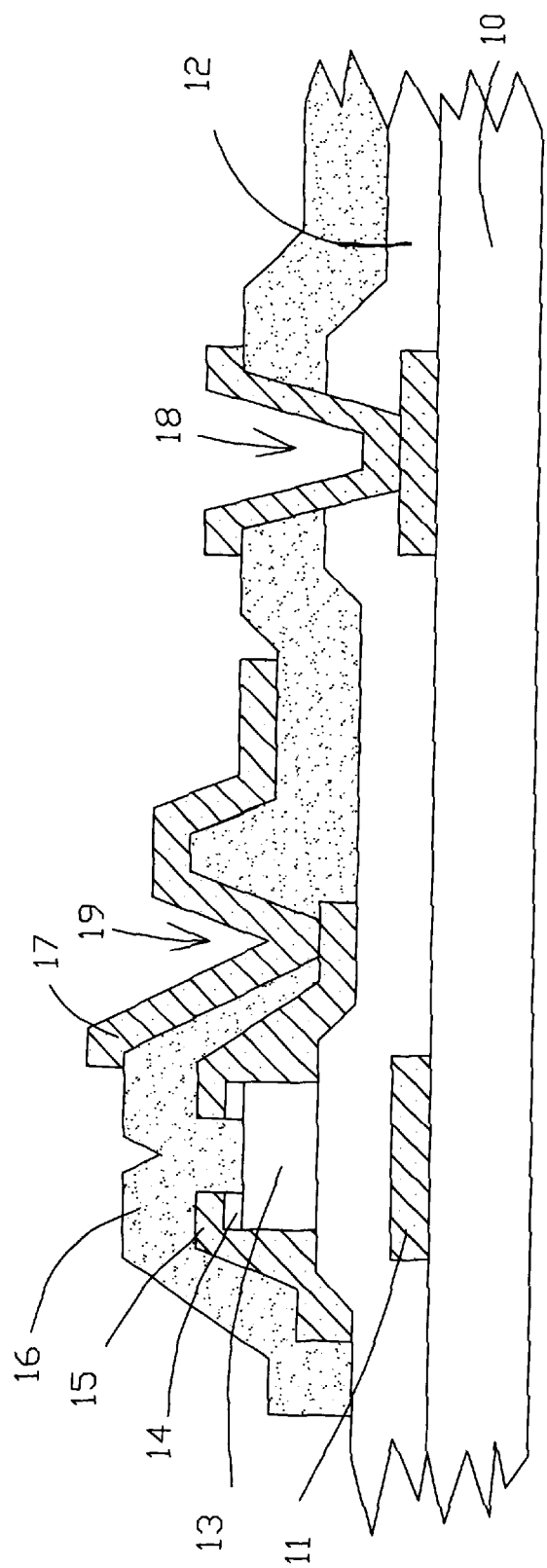
FIG. 1 shows a structure of a prior art 5-mask thin film transistor.
Figure 2:
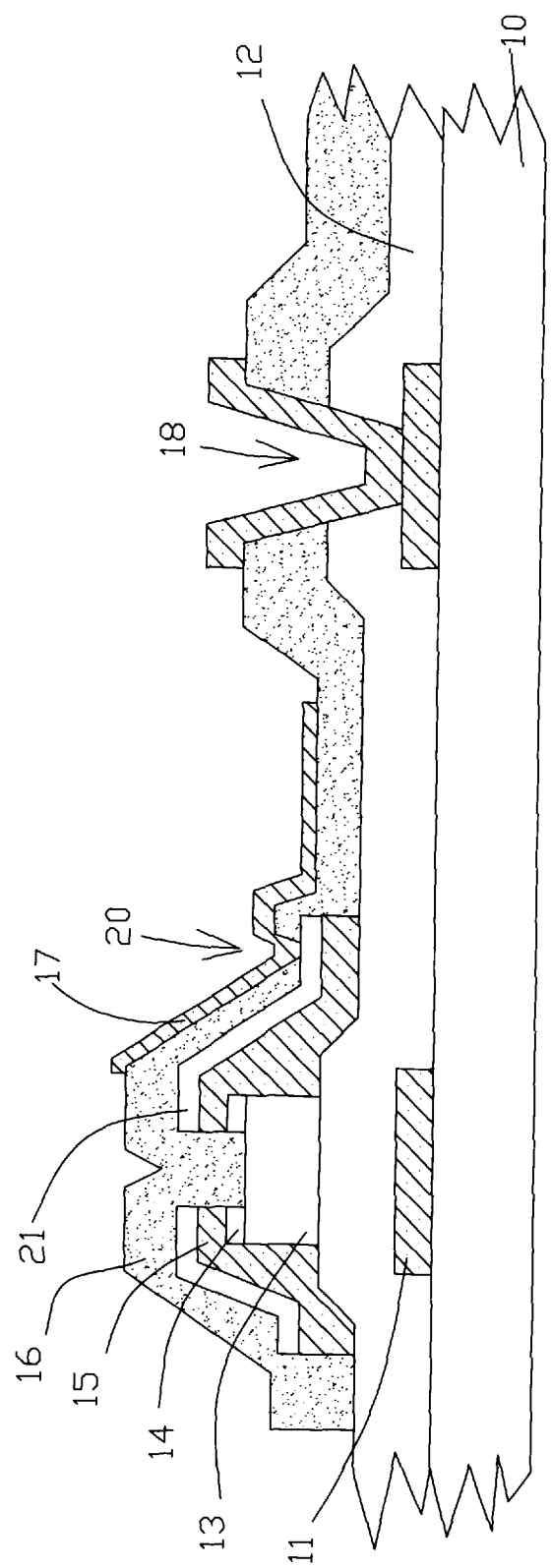
FIG. 2 illustrates one embodiment structure of the present invention.

FIG. 2 shows one embodiment of the present invention, in which the thin film transistor structure is provided as same as that shown in FIG. 1 except for the metal contact structure so as to emphasize the feature of the present invention. In particular, a gate electrode 11 is formed on a transparent substrate 10 with a gate insulator layer 12 covered thereon. An intrinsic semiconductor layer 13 and a doped semiconductor layer 14 are sequentially deposited on the gate insulator layer 12, and a source/drain electrode metal layer 15 is formed on the doped semiconductor layer 14. The present invention is characterized in that a metal oxide conductive film 21 is formed on the source/drain electrode metal layer 15. An insulative passivation layer 16 is deposited over the whole thin film transistor structure with a contact hole 20 formed thereof to reach the metal oxide conductive film 21. A top ITO conductive layer 17 is deposited on the passivation layer 16 and filled in the contact hole 20 to electrically connect with the metal oxide conductive film 21. In this embodiment, the source/drain electrode metal layer 15 could be single-layer metal or multi-layer metal, which is apparently to those skilled in the art. In addition, the present invention is suitable and practical for various thin film transistor structures and applications once different contact holes are corresponding to different etching depths.

Figure 3A:
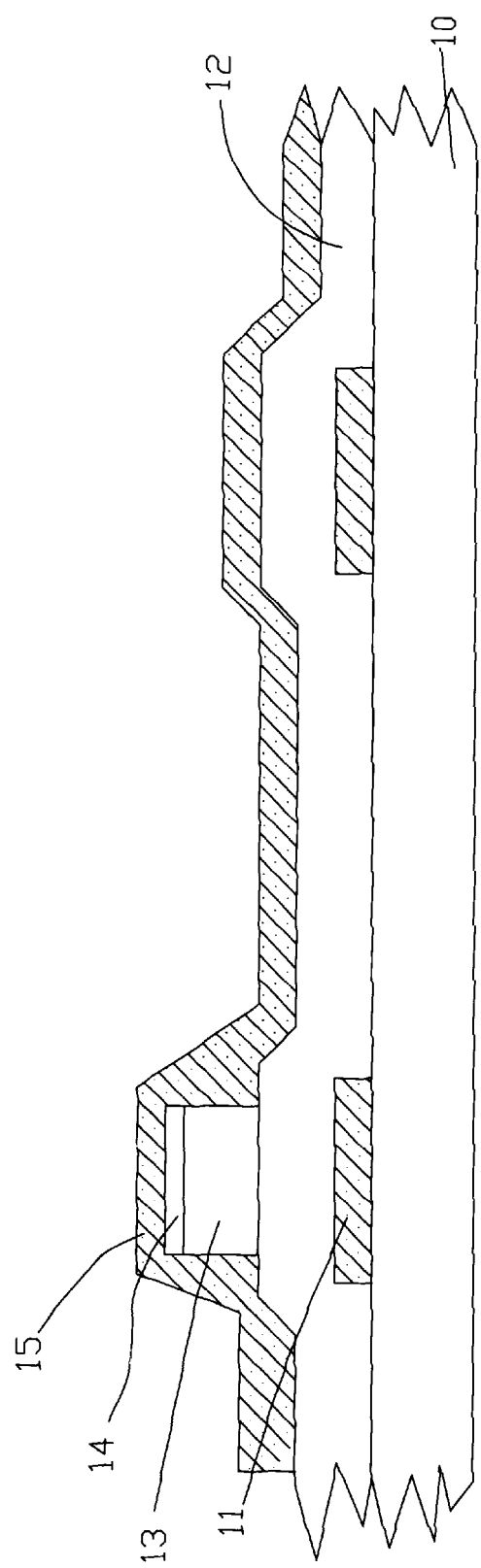
FIG. 3(A) is the cross-sectional view after the source/drain electrode metal layer is deposited.

One embodiment method of forming the device shown in FIG. 2 is provided in FIG. 3. As shown in FIG. 3(A), a transparent substrate 10, such as glass, plastic, and quartz, is provided to form a gate electrode 11 thereon, by sputtering and photolithography process for instance, with material selected from Cr, Al, Cu, Mo, Ta, Ti, and other low resistivity metal or metal alloy. Then, a silicon nitride or other insulator is deposited on the gate electrode 11 and substrate 10 to be the gate insulator layer 12 by chemical vapor deposition (CVD) or plasma-enhanced chemical vapor deposition (PECVD). An intrinsic semiconductor layer 13 and a low resistivity N type doped semiconductor layer 14 both composed of amorphous silicon (a-Si) are sequentially deposited on the gate insulator layer 12 by CVD, and then patterned and etched. A source/drain electrode metal layer 15 is deposited on the doped semiconductor layer 14 by the same process and with the same material as that for the gate electrode metal layer 11. Until now, the method uses the same processes as in the prior art.

Figure 3B:
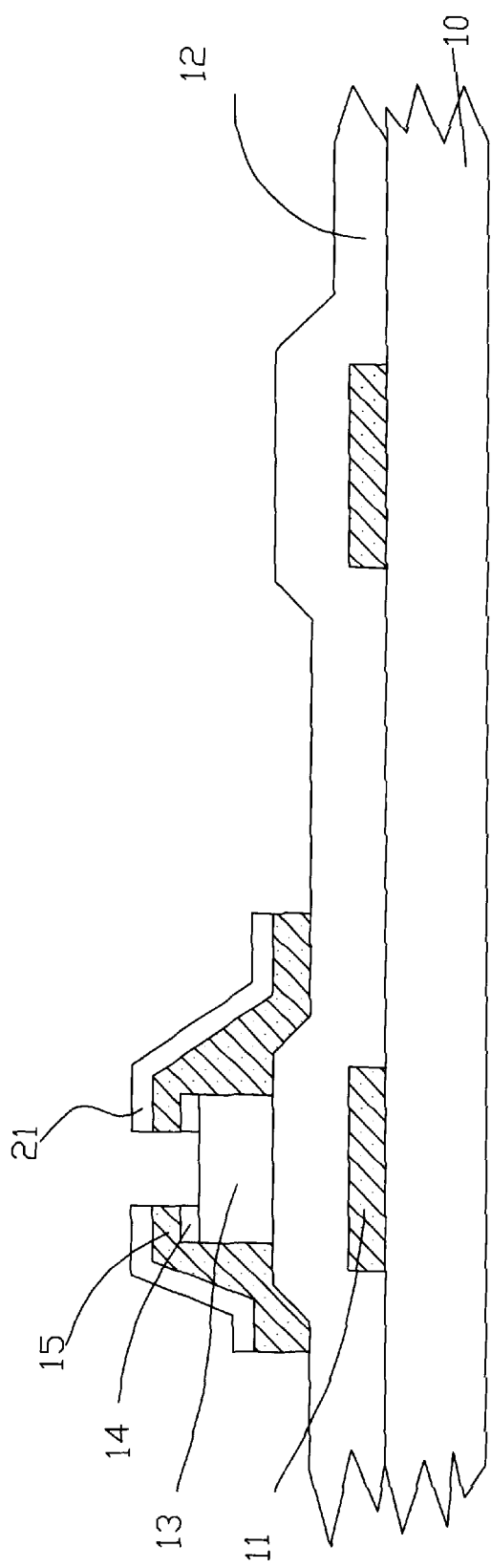
FIG. 3(B) is the cross-sectional view after the doped semiconductor layer is etched.

Subsequently, the important and feature step is followed. As shown in FIG. 3(B), a metal oxide conductive film 21 is formed on the source/drain electrode metal layer 15 of low resistivity material, such as ITO by sputtering or deposition process. The metal oxide conductive film 21 and source/drain electrode metal layer 15 are patterned by lithography and etched, such that these two layers extends from top surface of the doped semiconductor layer 14 to top surface of the gate insulator layer 12. The N type doped semiconductor layer 14 is etched to form an opening by self-alignment with the metal oxide conductive film 21 and source/drain electrode metal layer 15 served as the mask, so that the underlying intrinsic semiconductor layer 13 is exposed again.

Figure 3C:
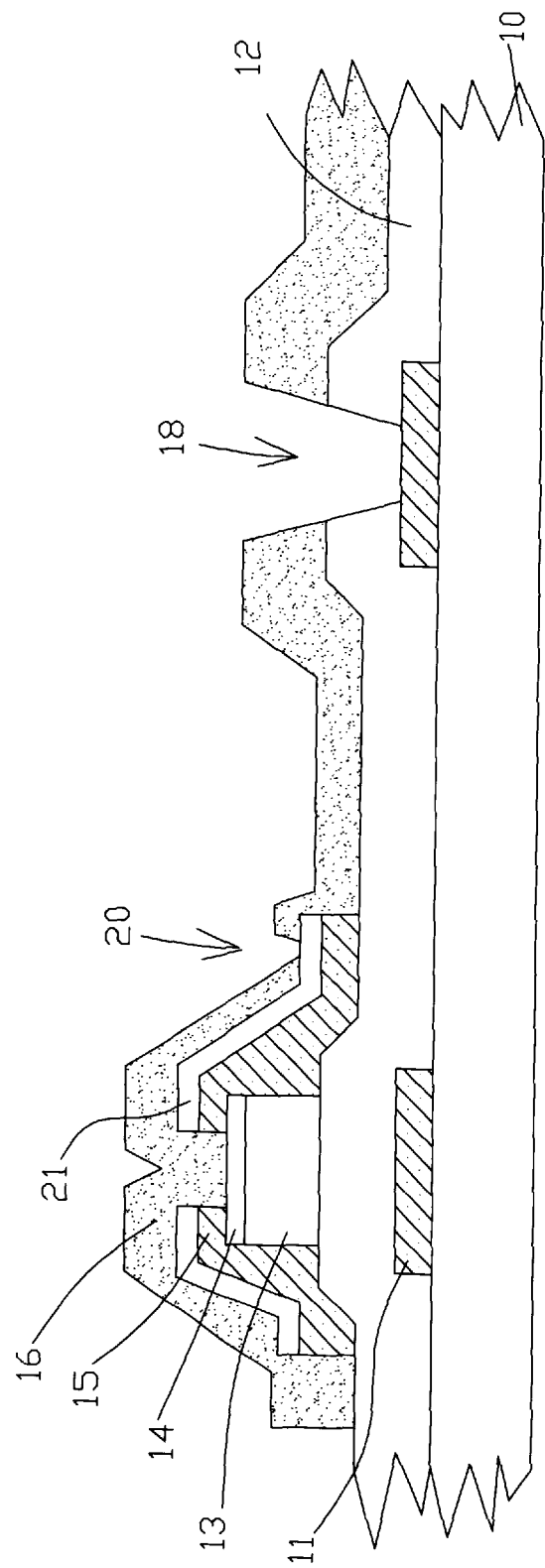
FIG. 3(C) is the cross-sectional view after the contact hole is formed.

As shown in FIG. 3(C), the whole thin film transistor structure is covered with an insulative passivation layer 16 formed of transparent epoxy or other insulator by spin coating or CVD. The passivation layer 16 is etched by dry etching, such as plasma etching and reactive ion etching (RIE), to form contact holes 18 and 20. Finally, a top ITO conductive layer 17 is deposited on the passivation layer 16 and filled in the contact holes 18 and 20, and then patterned and etched, to be the resultant structure shown in FIG. 2. In the etching process to form the contact holes 18 and 20, the contact hole 18 has a deeper etching depth since the passivation layer 16 and insulator layer 12 have to be etched through, while the etching depth of the contact hole 20 is smaller for only the passivation layer 16 is etched. However, the metal oxide conductive film 21 protects the underlying electrode metal 15 from plasma damage during the contact hole formation. Additionally, the surface of the metal oxide conductive film 21 is hard to form oxide insulator residue thereon. Further, the metal oxide conductive film 21 also comprises an oxide material, which is similar to the insulator layer 12 in corresponding to plasma etching, as a result, the difference between the etching depths of the contact holes 18 and 20 is compensated by the metal oxide conductive film 21. After the completion of the top ITO conductive layer 17, a heat treatment process can be further applied to improve the contact between the surface of the electrode and the top ITO conductive layer 17, as in the prior art.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A metal contact structure for a thin film transistor array in a liquid crystal display, said thin film transistor structure including a first metal layer formed on a substrate for gate electrode, and a gate insulator layer, an intrinsic semiconductor layer, a doped semiconductor layer, and a second metal layer for source and drain electrodes sequentially formed in stack thereon, said contact structure comprising:
   a metal oxide conductive film formed on said second metal layer;
   an insulative passivation layer covered over said thin transistor;
   a contact hole formed in said passivation layer and extended to said metal oxide conductive film; and
   an ITO conductive layer formed on said passivation layer and filled in said contact hole for electrically coupling with said second metal layer.

2. A metal contact structure for a thin film transistor in a liquid crystal display according to claim 1, wherein said metal oxide conductive film comprises ITO.

3. A thin film transistor in a liquid crystal display with low contact resistivity comprising:
   a substrate;
   a gate electrode metal layer formed on said substrate;
   a gate insulator layer covered said gate electrode metal layer and substrate;
   a stack of intrinsic and doped semiconductor layers formed on said gate insulator layer;
   a source/drain electrode metal layer formed on said doped semiconductor layer and extended onto said gate insulator layer;
   a metal oxide conductive film formed on said source/drain electrode metal layer;
   an insulative passivation layer covered said thin film transistor;
   a contact hole formed in said passivation layer and extended to said metal oxide conductive film; and
   an ITO conductive layer formed on said passivation layer and filled in said contact hole for electrically connecting with said metal oxide conductive film.

4. A thin film transistor in a liquid crystal display with low contact resistance according to claim 3, wherein said metal oxide conductive film comprises ITO.

5. A method of forming a thin film transistor in liquid crystal display for low contact resistivity comprising the steps of:
   forming a gate electrode metal layer on a substrate;
   forming a gate insulator layer covered on said gate electrode metal layer and said substrate;
   forming a stack of intrinsic and doped semiconductor layers on said gate insulator layer corresponding to said gate electrode metal layer;
   forming a source/drain electrode metal layer on said doped semiconductor layer and extending onto said gate insulator layer;
   forming a metal oxide conductive film on said source/drain electrode metal layer;
   patterning and etching said metal oxide conductive film and source/drain electrode metal layer;
   etching said doped semiconductor layer;
   depositing an insulative passivation layer covered said metal oxide conductive film and gate insulator layer;
   etching said passivation layer to form a contact hole extending to said metal oxide conductive film; and
   depositing an ITO conductive layer on said passivation layer and filled said contact hole for electrically connecting with said metal oxide conductive film.

6. A method of forming a thin film transistor in a liquid crystal display for low contact resistivity according to claim 5, wherein said metal oxide conductive film comprises ITO.

* * * * *